(12) United States Patent
Guenther et al.

(10) Patent No.: US 6,797,211 B1
(45) Date of Patent: Sep. 28, 2004

(54) MECHANICAL PATTERNING OF A DEVICE LAYER

(75) Inventors: Ewald Karl Michael Guenther, Singapore (SG); Zhong Chen, Singapore (SG); Brian Cotterell, Singapore (SG)

(73) Assignee: Osram Opto Semiconductors GmbH & Co. oHG, Regensburg (DE)

( * ) Notice: Subject to any disclaimer, the term of this patent is extended or adjusted under 35 U.S.C. 154(b) by 0 days.

(21) Appl. No.: 09/786,832
(22) PCT Filed: Jul. 9, 1999
(86) PCT No.: PCT/SG99/00074

§ 371 (c)(1),
(2), (4) Date: Jun. 13, 2001

(87) PCT Pub. No.: WO01/04938

PCT Pub. Date: Jan. 18, 2001

(51) Int. Cl.[7] .......................... B29C 59/02; B29C 59/04; B32B 31/22
(52) U.S. Cl. ....................................... 264/139; 264/293
(58) Field of Search ................................. 264/139, 293

(56) References Cited

U.S. PATENT DOCUMENTS 4,720,432 A    1/1988    VanSlyke et al.
5,259,926 A   11/1993   Kuwabara
5,669,303 A    9/1997   Maracas et al.

FOREIGN PATENT DOCUMENTS

GB    23 32985 A     7/1999
WO    97/06012 A1    2/1997

OTHER PUBLICATIONS

J.H. Burroughes et. al, LETTERS TO NATURE: "Light-emitting diodes based on conjugated polymers," vol. 347, Oct. 11, 1990, pp. 539–541.

Berggren, M., Dodabalapur, A., Slusher, R.E., Tinko, A., and Nalamasu, O., "Organic Solid–State Lasers with Imprinted Gratings on Plastic Substrate", Jan. 1998, Applied Physics Letter 72 (4) pp. 410–411.

*Primary Examiner*—Leo B. Tentoni
(74) *Attorney, Agent, or Firm*—Fish & Richardson P.C.

(57) ABSTRACT

A method of fabricating a device, including mechanically patterning a device layer using a stamp containing a desired pattern. The device layer is formed on a plastic or polymeric substrate. The stamp is pressed against the substrate under a load which patterns the device layer without cracking the device layer in the non-patterned areas.

53 Claims, 3 Drawing Sheets

MECHANICAL PATTERNING OF A DEVICE LAYER

FIELD OF THE INVENTION

The present invention relates to the fabrication of devices. More particularly, the invention relates to patterning of a device layer on a substrate.

BACKGROUND OF THE INVENTION

In device fabrication, one or more device layers are formed on a substrate. The layers are sequentially deposited and patterned to create features on the surface of the substrate. The layers can be patterned individually and/or as a combination of layers to form the desired features. The features serve as components that perform the desired functions, creating the device.

One type of device which is of particular interest is a light emitting diode (LED). Typically, an LED cell or pixel comprises one or more functional layers sandwiched between two electrodes to form a functional stack. Charge carriers are injected from both electrodes. These charge carriers recombine in the functional layer or layers, causing visible radiation to emit. Recently, significant advances have been made utilizing organic functional layers to form organic LEDs (OLEDs). Such devices are fabricated on rigid glass substrates having a thickness of about 0.3–1.1 mm.

Typically, OLED devices comprises a plurality of OLED pixels arranged to form a display, such as a flat panel display (FPD). A pixelated OLED device includes, for example, a plurality of first electrode strips formed on the substrate. The strips are arranged in a first direction. One of more organic layers are formed on the first electrodes strips. A plurality of second electrode strips is formed over the organic layers in a second direction. Typically, the first and second electrode strips are orthogonal to each other. The intersections of the first and second electrode strips form LED pixels.

The first electrode strips are created on the substrate by patterning an electrode layer. Conventionally, the electrode layer is patterned by photolithographic and etch processes. For example, a photosensitive resist layer is deposited on the electrode. The resist layer is exposed with radiation having the desired pattern defined by a mask. After development, unwanted resist is removed to expose portions of the electrode beneath. The exposed portions are removed by a wet etch, leaving the desired pattern on the electrode layer. Thus, conventional techniques for patterning the electrode require numerous steps, increasing raw process time and manufacturing cost.

As evidenced by the above discussion, it is desirable to provide a simplified process of patterning a device layer.

SUMMARY OF THE INVENTION

The invention relates to patterning a device layer on a substrate during device fabrication. In accordance with the invention, the patterning of the device layer an is achieved using a stamp with a pattern thereon. The pattern is formed by protrusions having a height greater than the thickness of the device layer to pattern the device layer. The stamp is pressed against the surface of the substrate under a load which patterns the device layer. The load is selected to precisely control cracking the edges of the patterned areas but without cracking the non-patterned areas.

PREFERRED EMBODIMENTS OF THE INVENTION

The invention relates generally to the fabrication of devices. In particular, the invention describes a process for patterning a device layer on a substrate, particularly a device layer formed on a ductile or flexible substrate. Various types of devices can be formed by the present invention. For example, electrical, mechanical, or electromechanical devices can be formed. Also, the invention can be useful in fabricating a microelectromechanical system (MEMS). In one embodiment, a process for forming a pixelated organic LED device is provided.

Figure 1:
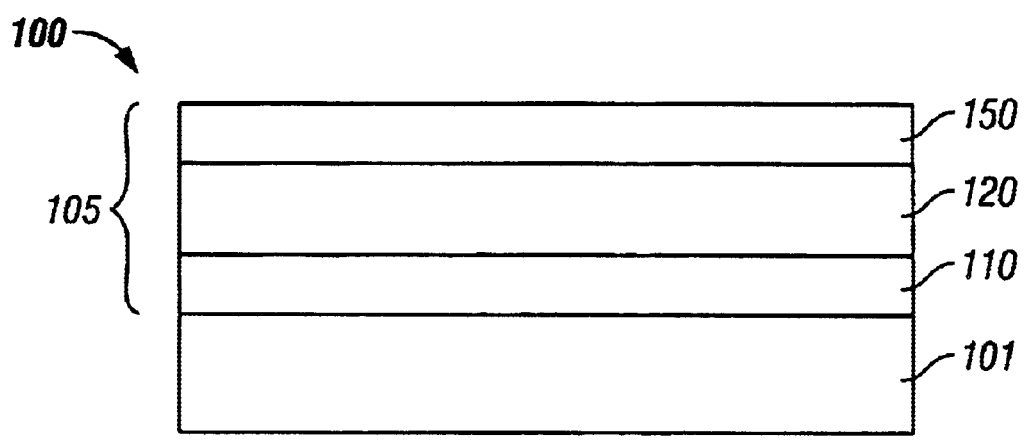
FIG. 1 shows an organic pixel LED.

FIG. 1 shows a cross-section of an OLED pixel. As shown, a substrate 101 is provided. The substrate provides support for the LED pixel. A functional stack 105 comprising of one or more organic functional layers 120 formed between conductive layers 110 and 150 is formed on the substrate, creating the LED pixel. The conductive layer 110 serves as an anode and the conductive layer 150 serves as a cathode.

A plurality of LED pixels can be arranged on the substrate to form an FPD. The FPD is used in various consumer electronic products, including cellular phones, cellular smart phones, personal organizers, pagers, advertising panel, touch screen displays, teleconferencing equipment, multimedia equipment, virtual reality products, and display kiosks.

FIGS. 2–5 show a process for patterning a device layer on a substrate in the fabrication of a device. In one embodiment, the device fabricated comprises a pixelated OLED device. Forming other types of devices such as electrical and/or mechanical devices, including sensor arrays, is also useful.

Figure 2:
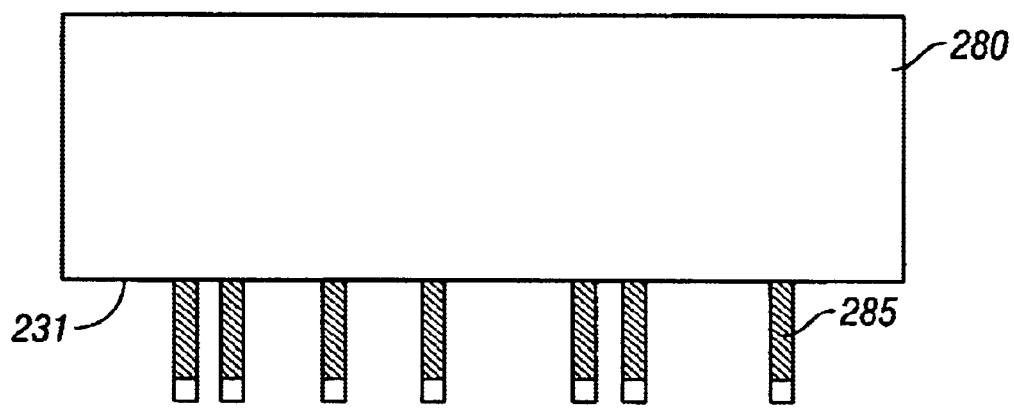
FIGS. 2–4 show a process for patterning a device layer in accordance with one embodiment of the invention.
Figure 2:
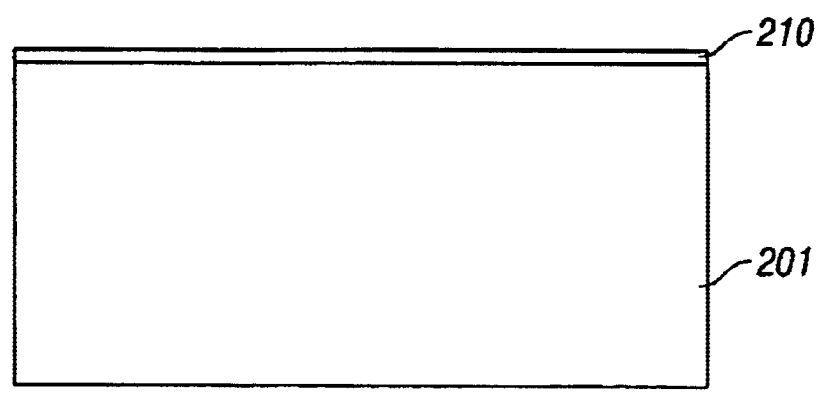

Referring to FIG. 2, a substrate 201 is provided on which the active components of the device are formed. The substrate comprises a plastic or a polymeric material. In one embodiment, the substrate comprises a flexible substrate, such as poly(ethylene terephthalate) (PET) or polyester for forming flexible devices. The substrate can comprise a transparent substrate to serve as, for example, a display surface for an OLED display. The use of a flexible transparent substrate for forming a flexible display is also useful. Various types of plastic substrates, such as PET, poly (butylene terephthalate) (PBT), poly(enthylene naphthalate) (PEN), Polycarbonate (PC), polyimides (PI), polysulfones (PSO), and poly(p-phenylene ether sulfone) (PES) are useful. Other substrates comprising polyethylene (PE), polypropylene (PP), poly(vinyl chloride) (PVC), polystyrene (PS) and poly(methyl methyleacrylate) (PMMA), can also be used.

In one embodiment, the substrate should be thin to result in a thin device while providing sufficient mechanical integrity during the fabrication process to support the active components. Preferably, the substrate should be as thin as possible while providing sufficient mechanical integrity during the fabrication process. The substrate thickness is, for example, about 20–200 μm. Thicker substrates are also useful. For example, thicker substrate, can be used where device thickness or flexibility is not an issue.

A device layer 210 is formed on the substrate. The device layer comprises, for example, a conductive layer. Other types of device layers, such as dielectrics or semiconductors, are also useful. In one embodiment the device layer comprises a transparent conductive layer that serves as an electrode for an LED device. The transparent conductive layer comprises an indium-tin-oxide (ITO). ITO is useful in forming the transparent anode of the LED device. Other transparent conductive layers, including zinc-oxide or indium-zinc-oxide are also useful. Various techniques, such as sputtering, physical vapor deposition (PVD), chemical vapor deposition (CVD) or plasma enhanced CVD (PECVD) can be employed to form the device layer. The device layer is deposited on the substrate to a thickness of about, for example, 100 nm. The thickness, of course, can vary depending on design requirements.

A stamp 280 comprising a desired pattern on a surface 231 is provided. The pattern is defined by protrusion 285 on surface 231. The stamp is made of a hard material such as steel, silicon, or ceramic. Other materials that are sufficiently hard can also be used to form the stamp.

In one embodiment, the pattern is deeper than the thickness of the device layer. This ensures proper patterning of the device layer. However, the height of the protrusions should be less than that which would compromise the support function of the substrate. In one embodiment, the height of the protrusions is at least about 2–10 times the thickness of the device layer, preferably 5–10 times the thickness of the device layer. For example, the height of the protrusions is about 0.5–1 $\mu$m for a 100 mm thick device layer. The height of the protrusions can be optimized according to the mechanical properties and thickness of the substrate.

Figure 3:
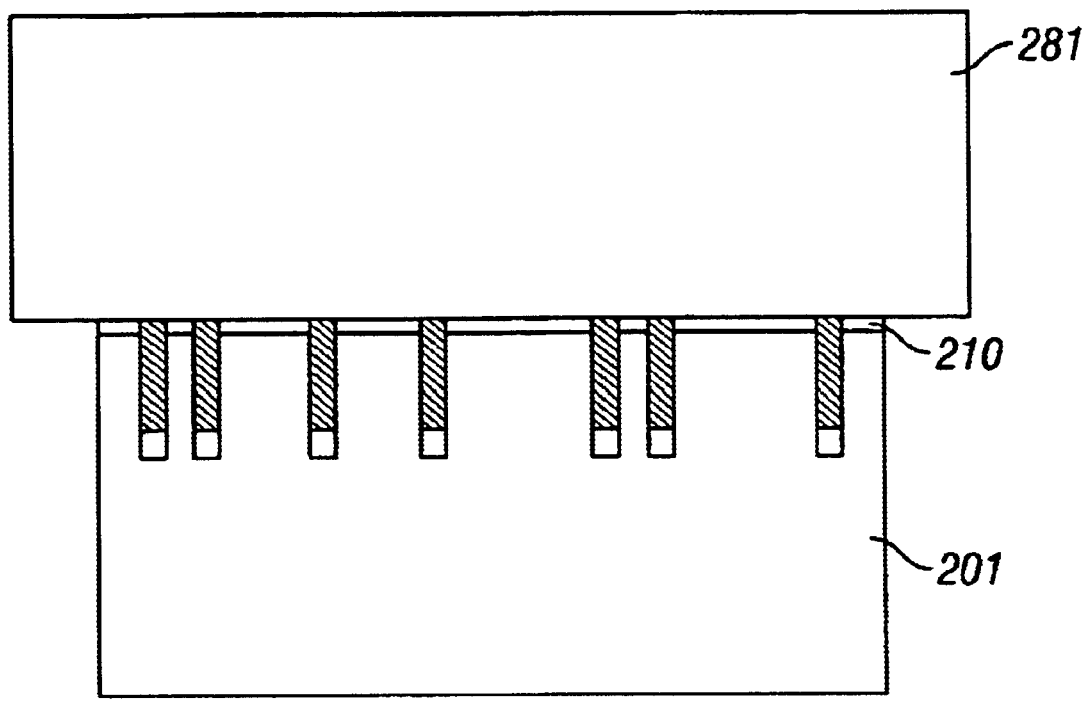

Referring to FIG. 3, a load is applied on the stamp 280, forcing the stamp against the substrate 201. This causes the pattern on the stamp to be transferred to the substrate. The load applied on the stamp is sufficient to prevent the device layer 210 from cracking in the active or non-patterned areas as it is patterned. In one embodiment, the net pressure of the load is about 200–400 MPa for a typical polymer substrate. In general, the required net pressure should exceed about 1.1 times the yield strength of the substrate material.

Figure 4:
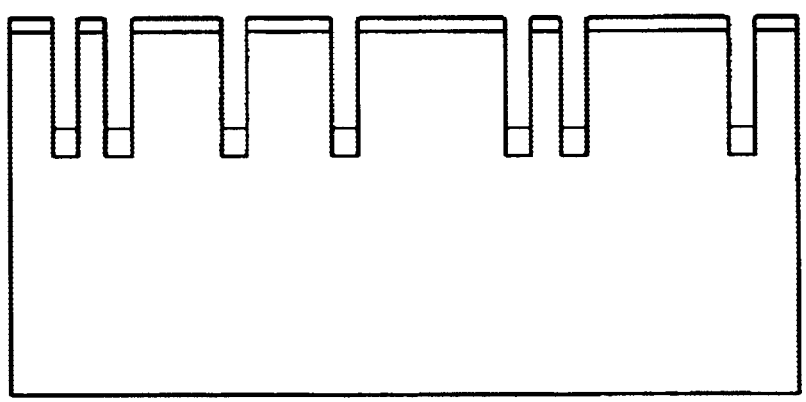

Referring to FIG. 4, the stamp is lifted from the substrate. As shown, the pattern on the stamp is transferred onto the device layer. In one embodiment, the device layer is patterned to form electrode strips on the substrate. Conventional processing continues to form the device.

In one embodiment, the process continues to fabricate OLED pixels of an OLED device. Fabrication of OLED pixels is described in, for example, U.S. Pat. No. 4,720,432 and Burroughes et al, Nature 347 (1990) 539, which are herein incorporated by reference for all purposes. This includes, for example, depositing one or more organic functional layers, such as conjugated polymer or $Alq_3$, on the electrode. Other types of organic layers can also be useful. Preferably, a plurality of functional layers is formed on the electrode. Second electrode strips comprising metal such as aluminum or other conductive material are formed over the functional layer. The second electrode strips are typically orthogonal to the bottom electrode strips. Providing second electrode strips that are diagonal to the bottom electrode strips is also useful. The intersections of the top and bottom electrode strips form OLED pixels. Various techniques can be used to form the electrode strips. For example, the second electrode strips can be formed by selective deposition techniques. Alternatively, the electrode strip can be formed by selectively patterning a top electrode layer to form the strips.

In an alternative embodiment, the pattern on the stamp can be formed to include a plurality of devices for parallel processing, thereby decreasing process time per device. The stamp pattern can be formed by a variety of techniques. Such techniques include, for example, grinding or photolithographic and etch processes.

Figure 5:
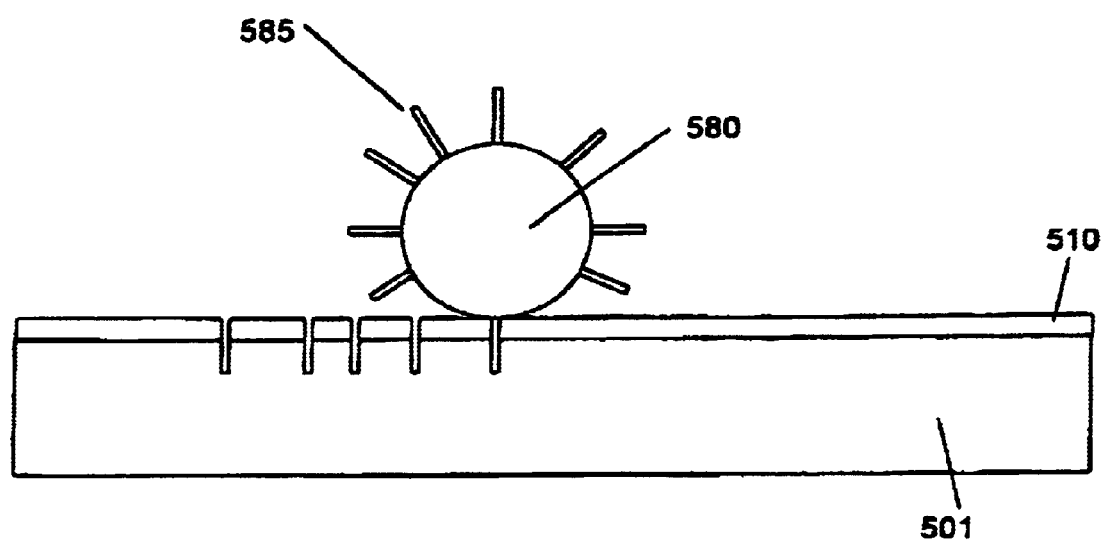
FIG. 5 shows an alternative process for patterning a device layer.

FIG. 5 shows another embodiment of the invention. As shown, a stamp comprising a drum 580 with the desired pattern 585 thereon is provided. The drum stamp is used in reel-to-reel processing. A long flexible substrate 501 with a device layer 510 formed thereon is provided. The substrate is translated through the drum while it is pressed under rotation, patterning the device layer. As shown, the substrate is translated in a direction from right to left and the drum stamp is rotated in the clockwise direction. Reversing the direction that the substrate is translated is also useful. Reel-to-reel processing enables parallel processing of devices.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. In the fabrication of a device, a method of patterning a device layer comprising:

providing a substrate comprising the device layer on its surface; and patterning the device layer by pressing a stamp comprising a pattern against the substrate and the device layer, wherein the pattern includes protrusions on a surface of the stamp, the protrusions having a height greater than a thickness of the device layer, wherein the protrusions directly pattern the device layer;

wherein the patterned device layer is a part of the fabricated device.

2. In the fabrication of a device, a method of patterning a device layer comprising:

providing a substrate comprising the device layer on its surface; and patterning the device layer by pressing a stamp comprising a pattern against the substrate, wherein the pattern includes protrusions on a surface of the stamp, the protrusions having a height that is greater than a thickness of the device layer;

wherein the device comprises an organic LED device.

3. The method of claim 2 wherein the substrate comprises a polymeric substrate.

4. The method of claim 3 wherein the substrate comprises a flexible or ductile substrate.

5. A method of pattering a device, comprising:

providing a transparent substrate, wherein the substrate has a device layer on its surface; and patterning the device layer by pressing a stamp comprising a pattern against the substrate, wherein the pattern includes protrusions on a surface of the stamp, the protrusions having a height that is greater than a thickness of the device layer;

wherein the device comprises an organic LED device.

6. The method of claim 5 wherein the device layer comprises a transparent conductive layer.

7. The method of claim 6 wherein the transparent conductive layer comprises a conductive oxide.

8. The method of claim 7 wherein the conductive oxide comprises indium-tin-oxide.

9. The method of claim 8 wherein patterning the device layer forms lower electrodes on the substrate.

10. The method of claim 9 wherein the height of the protrusions is at least about 2–10 times greater than the thickness of the device layer.

11. The method of claim 10 wherein the stamp is pressed against the substrate under a load without causing the device layer to crack in non-patterned areas.

12. The method of claim 11 wherein the load comprises a net pressure of greater than about 1.1 times a yield strength of the substrate.

13. The method of claim 12 further comprising processing to form OLED pixels.

14. The method of claim 13 wherein the processing to form OLED pixels comprises:
forming at least one organic functional layer on the lower electrodes; and
forming upper electrodes on the organic functional layer, wherein the OLED pixels are formed where the upper and lower electrodes sandwich the organic functional layer.

15. The method of claim 3 wherein the substrate comprises a transparent substrate.

16. The method of claim 15 wherein the device layer comprises a transparent conductive layer.

17. The method of claim 16 wherein patterning the device layer forms lower electrodes on the substrate.

18. The method of claim 17 wherein the stamp is pressed against the substrate under a load without causing the device layer to crack in non-patterned areas.

19. The method of claim 18 further comprising processing to form OLED pixels.

20. The method of claim 19 wherein the processing to form OLED pixels comprises:
forming at least one organic functional layer on the lower electrodes; and
forming upper electrodes on the organic functional layer, wherein the OLED pixels are formed where the upper and lower electrodes sandwich the organic functional layer.

21. The method of claim 3 wherein the device layer comprises a conductive layer.

22. A method of patterning a device layer, comprising:
providing a polymeric substrate comprising a device layer on its surface, wherein the device layer comprises a conductive layer; and
patterning the device layer by pressing a stamp comprising a pattern against the substrate, wherein the pattern includes protrusions on a surface of the stamp, the protrusions having a height that is greater than a thickness of the device layer, wherein the patterning forms lower electrodes on the substrate;
wherein the device comprises an organic LED device.

23. The method of claim 22, wherein the stamp is pressed against the substrate under a load without causing the device layer to crack in non-pattered areas.

24. The method of claim 23 further comprising processing to form OLED pixels.

25. The method of claim 24 wherein the processing to form OLED pixels comprises:
forming at least one organic functional layer on the lower electrodes; and
forming upper electrodes on the organic functional layer, wherein the OLED pixels are formed where the upper and lower electrodes sandwich the organic functional layer.

26. The method of claim 2 wherein the substrate comprises a material selected from the group consisting of polyester, poly(ethylene terephthalate), poly(butylene terephthalate), poly(enthylene naphthalate), polyethylenesterephtalate, polycarbonate, polyimides, polysulfones, poly(p-phenylene ether sulfone), polyethylene, polypropylene, poly(vinyl chloride), polystyrene, and poly(methyl methyleacrylate).

27. The method of claim 26 wherein the device layer comprises a conductive layer.

28. The method of claim 27 wherein the pattern is used to form lower electrodes on the substrate.

29. The method of claim 28, wherein the stamp is pressed against the substrate under a load without causing the device layer to crack in non-patterned areas.

30. The method of claim 29 further comprising processing to form OLED pixels, the method further comprising:
forming at least one organic functional layer on the lower electrodes; and
forming upper electrodes on the organic functional layer, wherein OLED pixels are formed where the upper and lower electrodes sandwich the organic functional layer.

31. The method of claim 1 wherein the substrate comprises a polymeric substrate.

32. The method of claim 31 wherein the height of the protrusions is at least about 5–10 times greater than the thickness of the device layer.

33. The method of claim 32 wherein the stamp is pressed against the substrate under a load without causing the device layer to crack in non-patterned areas.

34. The method of claim 33 wherein the load comprises a net pressure of greater than about 1.1 times a yield strength of the substrate.

35. The method of claim 34 further comprising processing to form the device.

36. The method of claim 35 wherein the device comprises a device selected from the group consisting of an electrical device, a mechanical device, a electromechanical device, and a microelectromechanical system.

37. The method of claim 31 wherein the stamp is pressed against the substrate surface under a load without causing the device layer to crack in non-patterned areas.

38. The method of claim 37 further comprises processing to form the device.

39. The method of claim 37 wherein the device comprises a device selected from the group consisting of an electrical device, a mechanical device, a electromechanical device, and a microelectromechanical system.

40. The method of claim 1 wherein the substrate comprises a material selected from the group consisting of polyester, poly(ethylene terephthalate), poly(butylene terephthalate), poly(enthylene naphthalate), polyethylenesterephtalate, polycarbonate, polyimides, polysulfones, poly(p-phenylene ether sulfone), polyethylene, polypropylene, poly (vinyl chloride), polystyrene, and poly(methyl methyleacrylate).

41. The method of claim 40 wherein the stamp is pressed against the substrate under a load without causing the device layer to crack in non-patterned areas.

42. The method of claim 41 further comprising processing to form the device.

43. A method of patterning a device layer in the fabrication of a device, comprising:

rotating a stamp comprising a drum with a pattern; and translating a substrate with a device layer thereon as the stamp is rotated to directly pattern the device layer;

wherein the patterned device layer is a part of the fabricated device.

44. The method of claim 43 wherein the substrate comprises a polymeric substrate.

45. The method of claim 44 wherein the pattern is produced by protrusions on a surface of the stamp.

46. The method of claim 45 wherein the protrusions comprise a height greater than a thickness of the device layer to pattern the device layer.

47. The method of claim 46 wherein the stamp is pressed against the substrate under a load without causing the device layer to crack in on non-patterned areas.

48. The method of claim 47 further comprising processing to form the device.

49. The method of claim 48 wherein the device comprises a device selected from the group consisting of an electrical device, a mechanical device, a electromechanical device, and a microelectromechanical system.

50. The method of claim 48 wherein the device comprises an OLED device.

51. The method of claim 43, wherein:

translating a substrate includes separating the device layer into a first portion and a second portion;

the first portion contacts protruding portions of the pattern during the step of translating the substrate; and the first portion does not contact the second portion after the step of translating the substrate.

52. The method of claim 1, wherein:

patterning the device layer includes separating the device layer into a first portion and a second portion;

the first portion contacts protrusions of the pattern during the step of patterning the device layer; and the first portion does not contact the second portion after the step of patterning the device layer.

53. The method of claim 2, wherein:

patterning the device layer includes separating the device layer into a first portion and a second portion;

the first portion contacts the protrusions of the pattern during the step of patterning the device layer; and the first portion does not contact the second portion after the step of patterning the device layer.

* * * * *

UNITED STATES PATENT AND TRADEMARK OFFICE
CERTIFICATE OF CORRECTION

PATENT NO. : 6,797,211 B1
DATED : September 28, 2004
INVENTOR(S) : Brian Cotterell, Zhong Chen and Ewald Karl Michael Guenther It is certified that error appears in the above-identified patent and that said Letters Patent is hereby corrected as shown below:

Title page,
Item [73], Assignee, replace "Osram Opto Semiconductors GmbH & Co. oHG, Regensburg (DE)" with -- Osram Opto Semiconductors GmbH & Co. OHG, Regensburg (DE) --

Column 6,
Line 49, replace "The method of claim 37 wherein the device comprises" with
-- The method of claim 38 wherein the device comprises --

Signed and Sealed this

Twenty-sixth Day of April, 2005

JON W. DUDAS
*Director of the United States Patent and Trademark Office*